(12) United States Patent
Meissner et al.

(10) Patent No.: US 6,534,992 B2
(45) Date of Patent: Mar. 18, 2003

(54) METHOD FOR DETERMINING THE PERFORMANCE OF A STORAGE BATTERY

(75) Inventors: Eberhard Meissner, Wunstorf (DE); Ingo Koch, Hameln (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 10/071,637

(22) Filed: Feb. 7, 2002

(65) Prior Publication Data

US 2002/0113593 A1 Aug. 22, 2002

(30) Foreign Application Priority Data

Feb. 17, 2001 (DE) .......................................... 101 07 583

(51) Int. Cl.$^7$ ............................................. G10N 27/416
(52) U.S. Cl. ....................................................... 324/426
(58) Field of Search ................................. 320/134, 136; 324/426, 427, 430, 431, 433

(56) References Cited

U.S. PATENT DOCUMENTS

| | | | | |
|---|---|---|---|---|
| 3,862,861 A | * | 1/1975 | McClelland et al. | |
| 3,873,911 A | * | 3/1975 | Champlin | |
| 3,909,708 A | * | 9/1975 | Champlin | |
| 5,851,696 A | * | 12/1998 | Saidi et al. | |
| 6,456,042 B1 | * | 9/2002 | Kwok | |

FOREIGN PATENT DOCUMENTS

| | | |
|---|---|---|
| DE | 37 12 629 C2 | 10/1987 |
| DE | 39 01 680 C2 | 3/1990 |
| DE | 197 50 309 A1 | 5/1999 |

* cited by examiner

*Primary Examiner*—Edward H. Tso
(74) *Attorney, Agent, or Firm*—Schnader Harrison Segal & Lewis LLP

(57) ABSTRACT

A method for determining performance of a storage battery including evaluating a time profile of voltage drop in the storage battery by application of a heavy current load, determining a voltage A from voltage response U(t) of the storage battery after switching on the heavy current load, determining a state value A1 from the voltage value A, battery temperature $T_{BAT}$ and state of charge SOC, comparing state value A1 with a preset value $A1_x$ which depends at least on associated battery temperature ($T_{BAT}$) and associated state of charge (SOC) of the storage battery, wherein the present value $A1_x$ is calculated from comparison values $A1_T$ which are determined from the state values A1 for previous heavy current loads applied to the storage battery, and determining performance of the storage battery from the difference between the present value $A1_x$ and the state value A1.

11 Claims, 2 Drawing Sheets

METHOD FOR DETERMINING THE PERFORMANCE OF A STORAGE BATTERY

FIELD OF THE INVENTION

The invention relates to a method for determining the performance of a storage battery by evaluating the time profile of the voltage drop with a heavy current load.

BACKGROUND

For most applications, the performance of a storage battery is measured by its capability to emit or absorb a specific amount of electrical power without predetermined voltage thresholds being undershot or overshot in the process. One major influencing variable for this capability is the internal resistance of the starter battery at that time, which is governed firstly by the type of battery and secondly, in general, both by the battery temperature $T_{BAT}$ at that time and the state of charge SOC of the battery at that time, as well as the wear that has already occurred.

To determine the internal resistance, the battery voltage is normally measured at different load currents, and the resistance is calculated from the numerical ratio of the voltage change to the current change.

The validity of such a method becomes better the greater the current change, and the greater the voltage change associated with it. Such methods require test equipment to measure the voltage and current over a wide value range. However, it is often desirable to avoid using additional costly test equipment to measure the battery current.

DE 3901680-C1 discloses a method for monitoring the cold-starting capability of the starter battery for an internal combustion engine, in which the time profile of the voltage drop that occurs during starting is monitored and evaluated. The evaluation is in this case carried out on the basis of limit values of an empirically obtained characteristic, and as a function of the battery temperature.

DE 3712629-C1 discloses a measurement apparatus for the remaining life of a motor vehicle battery, in which the battery voltage and the associated load current value are detected before and after initial starting with the battery in the fully charged state, the temperature-compensated internal resistance is determined and stored in a memory, and compared with the internal resistance values determined during the subsequent starting processes for the internal combustion engine. The indication is then produced as a function of predetermined, stored threshold values.

DE 197 50 309 A1 describes a method for determining the starting capability of the starter battery for a motor vehicle, in which the voltage drop during starting is measured and compared with the values in a family of characteristics. This family of characteristics comprises the mean value of the voltage drops measured during the starting process and the associated battery and engine temperatures. If the difference exceeds a predetermined value, then an indication or alarm function is triggered. The measured values of the voltage drop taken into account in the family of characteristics originate, in one particular embodiment, from the new phase period, which lasts for 6 to 18 months, in the sense of a learning phase for the normal state, before any wear occurs, and thus takes account of the respective characteristics in the vehicle, such as characteristics of the installed battery, the internal combustion engine and of the electrical installation.

Thus, it would be advantageous to provide an improved method for assessment of the present performance of a storage battery, which also allows prediction of the performance of the battery in other states, for example, a different state of charge SOC and a different battery temperature $T_{BAT}$, than the present states.

SUMMARY OF THE INVENTION

This invention relates to a method for determining performance of a storage battery including evaluating a time profile of a voltage drop in the storage battery by application of a heavy current load, determining a voltage A from voltage response U(t) of the storage battery after switching on the heavy current load, determining a state value A1 from the voltage value A, battery temperature $T_{BAT}$ and state of charge SOC, comparing state value A1 with a preset value $A1_x$ which depends at least on associated battery temperature ($T_{BAT}$) and associated state of charge (SOC) of the storage battery, wherein the present value $A1_x$ is calculated from comparison values $A1_T$ which are determined from the state values A1 for previous heavy current loads applied to the storage battery, and determining performance of the storage battery from the difference between the present value $A1_x$ and the state value A1.

BRIEF DESCRIPTION OF THE DRAWINGS

The subject matter of the invention will be explained in more detail in the following text with reference to the drawings.

DETAILED DESCRIPTION

According to the invention, in addition to the temperature of the battery, its state of charge is taken into account as a major influencing variable for its internal resistance and its capability to provide power.

The measurement of the voltage collapse that occurs when a load is switched on requires at least two voltage measurements to be precise before and after the load is switched on. In the specific case of assessment of a starter battery in a motor vehicle, however, current is also actually flowing before the main current for the starter motor is switched on. In modern motor vehicles, currents of several tens of amperes may flow just due to the engine control process once the ignition system has been switched on.

The invention, therefore, provides that the assessment measure should not only include the voltage collapse with a heavy current load, but should also use the voltage response of the battery to the electrical load process, that is to say, the time profile U(t) of the voltage, to determine a voltage value A. This voltage value A may, therefore, include more than just two discrete voltage measured values.

In the method according to the invention, a voltage value A is first determined as an intermediate variable from the voltage response U(t) by using one of the following methods.

One method is to carry out a curve discussion of U(t). Depending on the embodiment of the invention, the voltage value A is assigned the absolute minimum value, a relative minimum value or a relative maximum value, a point of inflection, a gradient, etc., from the curve discussion of U(t). It is particularly advantageous to assign the absolute minimum value U(t) to the voltage value A.

A further option is for U(t) to pass through filtering before the above-mentioned curve discussion, which filtering is carried out by using a low-pass filter or by forming a mean value over a defined time interval. This results in a filtered curve profile F(U(t)), on which the curve discussion is then carried out.

Figure 1:
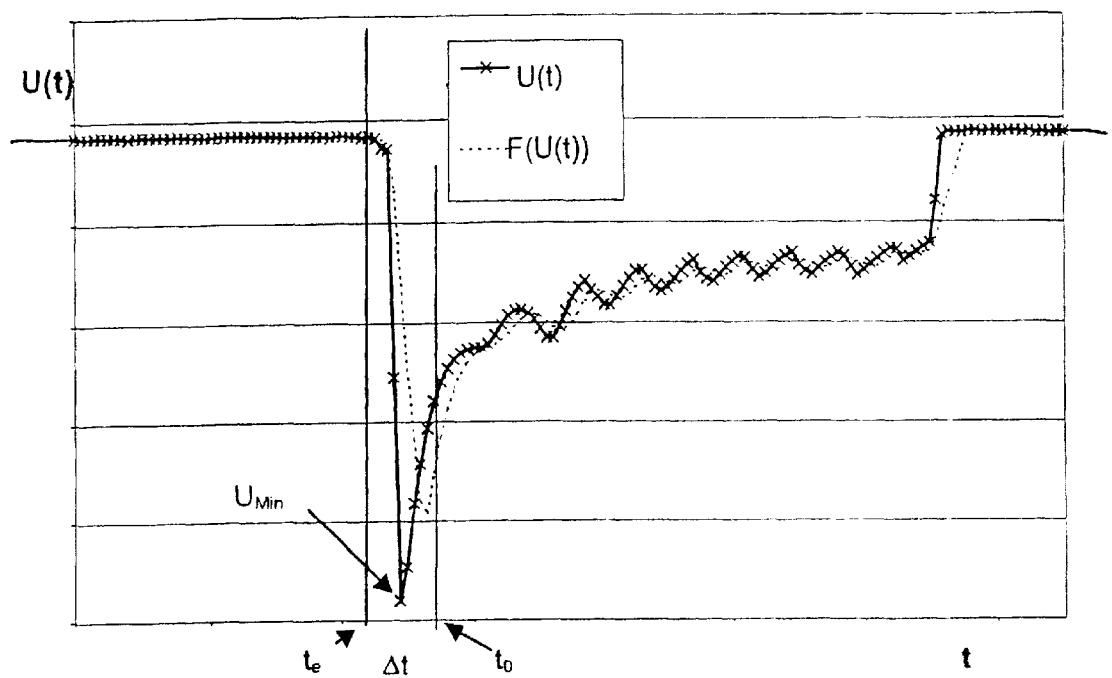
FIG. 1 is a graph showing an illustration of the voltage response U(t) of a storage battery to a heavy current load, and the calculated running mean value of these measured voltage values.

One example for a voltage response U(t) and for its filtered profile F(U(t)) is illustrated in FIG. 1. In this example, the filtered F(U(t)) is calculated by using the formation of a running mean value.

The advantage of additional filtering of the voltage response U(t) by means of a filter function F is that it is generally problematic to measure individual voltage values with an electrical load to determine the voltage collapse. Measurement errors or inaccurate determination of the time of the measurement can make it harder to achieve a valid comparison with a nominal value, a family of characteristics or the like.

A further method is to assign to the voltage value A the voltage value $U(t_0)$ or the filtered voltage value $F(U(t_0))$ at a fixed time $t_0$. In this case, to is the time which occurs, offset by the time interval $\Delta t$ after the time $t_e$, at which a specific event occurs, for example, the commencement of the starting process or the occurrence of the minimum voltage value $U_{Min}$ in the curve U(t). This method is illustrated schematically in FIG. 1.

The filtering may, for example, comprise a low-pass filter with a maximum time constant of about 50 milliseconds, or the formation of mean values over a maximum time period of about 100 milliseconds.

This voltage value A, determined in accordance with one of the stated options, is then linked with $T_{BAT}$ and the SOC in a mathematical function to take account of the battery temperature $T_{BAT}$ and the state of charge SOC, with the simplest linking process being to multiply the voltage value A by empirically obtained constants for $T_{BAT}$ and the SOC. This linking process then results in the state value A1. It is advantageous to assign the value A directly to the value A1.

In a further refinement of the method according to the invention, the voltage value A is determined from the voltage response U(t) of the battery and from at least one of the variables comprising the inductance, capacitance or resistance of the circuit. The background to this is that the electrical equivalent circuit of an actual circuit normally contains such components, and their numerical values may be known. In the case of the circuit for the starter battery of an internal combustion engine, this circuit comprises inductances (the starter motor winding), resistances (wire, winding) and capacitances (battery).

The state value A1 is then compared with a preset value $A1_x$. The preset value $A1_x$ is calculated from comparison values $A1_T$ which have been determined by mathematical methods from the state values A1 from previous heavy current loads. This is done by in each case determining the state values A1 (SOC, $T_{BAT}$) from the voltage response U(t) of the battery to the electrical loading process in the battery state (SOC, $T_{BAT}$) in a specific time period. The set of these state values A1 (SOC, $T_{BAT}$) obtained in a specific time period is then the basis for the comparison values $A1_T$ as a function of the value combination (SOC, $T_{BAT}$).

The learning process may also be carried out by using an artificial neural network.

Such a learning phase starts, in particular, when the battery is replaced or when some other change occurs that has a major influence on the heavy current load. The end of the learning phase may be defined, for example, by a predetermined time period, by the number of events which can be evaluated and which lead to determination of a state value A1, by the wide range of different battery states (SOC, $T_{BAT}$) in which such state values A1 have been determined, or by other criteria which, for example, influence the aging of batteries, such as the integral of their energy throughput or the time in poor operating states, or combinations of such criteria.

Figure 2:
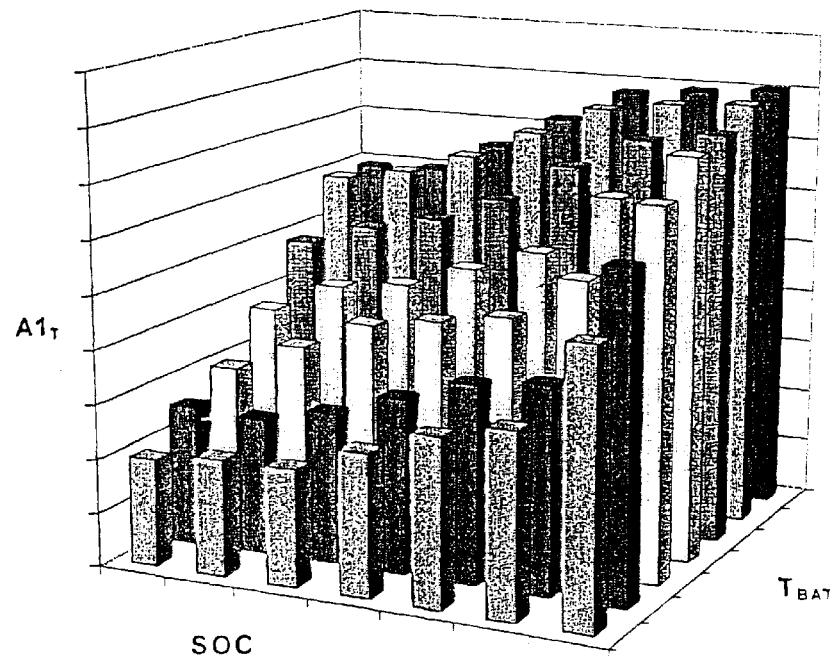
FIG. 2 is a graph showing an example of an illustration of the discrete predetermined values $A1_T$ as a function of the state of charge and temperature of the storage battery.

The preset value $A1_x$ determined as above is regarded as the "normal value" for the present state of charge SOC and the present battery temperature $T_{BAT}$. The performance of the storage battery at a specific time is assessed by comparison of the state value A1 determined in the state (SOC, $T_{BAT}$) at that time with the preset value $A1_x$ obtained in the same state (SOC, $T_{BAT}$) during the learning phase. However, since no event has generally occurred during the learning phase with precisely this value combination (SOC, $T_{BAT}$) at that time, $A1_x$ is, as a substitute, determined by a mathematical method from the set of comparison values $A1_T$ obtained with other value combinations (SOC, $T_{BAT}$) during the learning phase. This may be an interpolation or extrapolation, based on support values of measured value combinations (SOC, $T_{BAT}$), or may be a functional relationship which describes the dependency of the "normal value" $A1_x$ (SOC, $T_{BAT}$) on the value combination (SOC, $T_{BAT}$). By way of example, FIG. 2 shows the fundamental dependency of comparison values $A1_T$ on the SOC and $T_{BAT}$ for a discrete $A1_T$ case.

According to the invention, it is also possible to use the voltage response to determine a number of state values A11, A12, ..., to compare these values to A11, A12, ... with preset values $A1_x1, A1_x2, \ldots$ which depend at least on the associated battery temperature and the associated state of charge (SOC) of the storage battery, with the preset values $A1_x1, A1_x2, \ldots$ having been calculated from the comparison values $A1_T1, A1_T2, \ldots$ which were determined by mathematical methods from values A11, A12, ... from previous heavy current loads, and to use the weighted differences ($A1_x1$–A11), ($A1_x2$–A12), ... between the predetermined values $A1_x1, A1_x2, \ldots$ and the measured values A11, A12, ... to deduce the performance of the storage battery.

However, it is not just possible to determine the performance in the present state (SOC, $T_{BAT}$) on the basis of the voltage response U(t) in this state, but also the performance in a different state (SOC*, $T_{BAT}$*). The latter requires the prediction of the hypothetical voltage response U*(t) in this different state (SOC*, $T_{BAT}$*) on the basis of the measured voltage response U(t) and/or the prediction of the state value A1, obtained from this, in the state (SOC, $T_{BAT}$) to A1* in the state (SOC*, $T_{BAT}$*).

Figure 3:
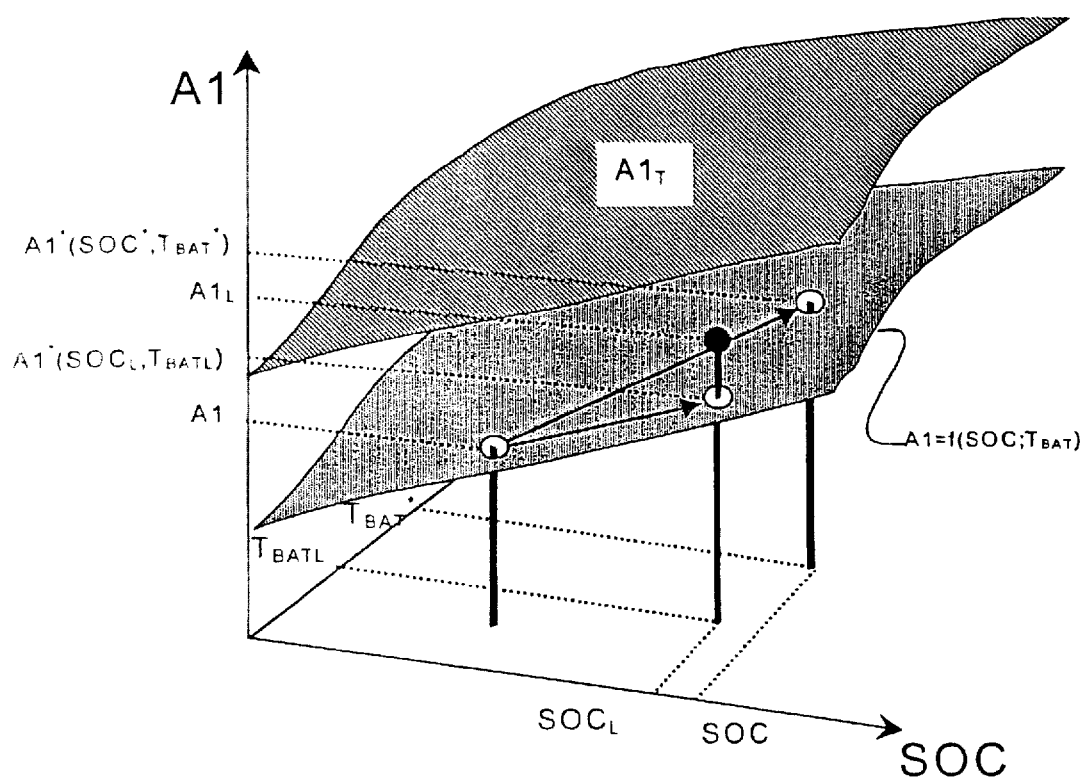
FIG. 3 is a graph showing a scheme for prediction of A1 (SOC, $T_{BAT}$) in different states (SOC*, $T_{BAT}$*) by using information about the functional relationship of $A1_T$ with the SOC and $T_{BAT}$.

This is feasible if the functional relationship between the voltage response U(t) or the state value A1 and the parameters SOC and $T_{BAT}$ is known. This procedure is illustrated schematically in FIG. 3.

In addition, if a limit value $A1_L$ has been preset for the state value for a defined state of charge $SOC_L$ and a defined battery temperature $T_{BATL}$, it is possible to make a statement on the performance of the battery, with respect to the limit value $A1_L$, by prediction of the state value A1 in this state ($SOC_L$, $T_{BATL}$), by comparing the predicted state value A1* for ($SOC_L$, $T_{BATL}$) determined in this way with the limit value $A1_L$. This procedure is illustrated schematically in FIG. 3.

For all the state values A1 obtained whose state of charge SOC and battery temperature $T_{BAT}$ do not correspond to SOC* and $T_{BAT}*$, it is possible to use the information about the functional relationship of the values $A1_T$ as they relate to the SOC and $T_{BAT}$ to convert to the value A1* for any given SOC* and any given temperature $T_{BAT}*$, and to use the magnitude of this value A1*, obtained in this way, for SOC* and $T_{BAT}*$ to deduce the performance at that time for SOC* and $T_{BAT}*$. By way of example, a limit value $A1_L$ is preset for the performance of the storage battery with a defined state of charge $SOC_L$ and a defined battery temperature $T_{BATL}$.

On the assumption that A is assigned the absolute minimum of U(t) and that A1 is assigned A, a simple example is described, in which the voltage $A1_L$ must not fall below 6 V when an engine is started with $T_{BAT}=-18°$ C. and with a state of charge (SOC) of 50%. For all the state values A1 obtained whose state of charge SOC and battery temperature $T_{BAT}$ do not correspond to this value, a conversion is carried out to the value A1* for $SOC_L$ and $T_{BATL}$, and the performance at that time for $SOC_L$ and $T_{BATL}$ is deduced from the magnitude of this stage value A1* for $SOC_L$ and $T_{BATL}$, compared with the limit value $A1_L$ from $SOC_L$ and $T_{BATL}$. This comparison is used as a measure of the instantaneous performance of the storage battery.

This refinement of the invention allows assessment of the performance of the storage battery, for example, in a reference state or in a state (SOC*, $T_{BAT}*$) assumed for the future. Thus, for example, it is possible to predict the starting capability of a starter battery in a motor vehicle on the next morning, if it is predicted that the battery temperature will have fallen from the present value to $T_{BAT}*$, and the state of charge may also have changed from the present value to SOC*.

The result for the performance of the storage battery determined in this way can be linked to the result from another method for determining the state of charge, the performance, the availability or the age of the storage battery, and the result of this linking process, or a variable derived from it, can be indicated and/or used for open-loop or closed-loop control of measures.

It is likewise within the scope of the invention for further variables which are measured in or on a vehicle, such as the outside temperature, the rotation speed of the internal combustion engine during the starting process or the engine temperature, to be used to calculate the state value A1.

The method according to the invention makes it possible to assess the capability of batteries to start internal combustion engines. However, it may also be used in many other applications in which a high electrical load is regularly applied to a battery. The load can be associated both with discharging and with charging of the battery.

What is claimed is:

1. A method for determining performance of a storage battery comprising:
   evaluating a time profile of voltage drop in the storage battery by application of a heavy current load;
   determining a voltage A from voltage response U(t) of the storage battery after switching on the heavy current load;
   determining a state value A1 from the voltage value A, battery temperature $T_{BAT}$ and state of charge SOC;
   comparing state value A1 with a preset value $A1_x$ which depends at least on associated battery temperature $T_{BAT}$ and associated state of charge SOC of the storage battery, wherein the present value $A1_a$ is calculated from comparison values $A1_T$ which are determined from the state values A1 for previous heavy current loads applied to the storage battery; and
   determining performance of the storage battery from the difference between the present value $A1_x$ and the state value A1.

2. The method as claimed in claim 1, wherein a minimum of the voltage response is selected as the voltage value A.

3. The method as claimed in claim 1, wherein the state value A1 is selected to be substantially equal to the voltage value A.

4. The method as claimed in claim 1, wherein in the state value A1 is determined from the voltage response of the storage battery with a heavy current load and from at least one variable selected from the group consisting of inductance, capacitance and resistance of an associated circuit.

5. The method as claimed in claim 1, wherein the comparison values $A1_T$ are determined from storage battery voltage responses U(t) obtained from previous heavy current loads in a selected time period.

6. The method as claimed in claim 1, wherein the preset value $A1_x$ is determined by interpolation or extrapolation from the comparison values $A1_T$.

7. The method as claimed in claim 1, wherein the voltage response U(t) is used to determine a number of state values A11, A12, . . . , wherein these state values A11, A12, . . . are compared with preset values $A1_x1$, $A1_x2$, . . . which depend at least on the associated battery temperature $T_{BAT}$ and the associated state of charge SOC of the storage battery, with the preset values $A1_x1$, $A1_x2$, . . . having been calculated from the comparison values $A1_T1$, $A1_T2$, . . . which were determined from state values A11, A12, . . . from previous heavy current loads, and wherein weighted differences $(A1_x1-A11)$, $(A1_x2-A12)$, . . . between the preset values $A1_x1$, $A1_x2$ and the measured state values A11, A12, . . . are used to determine the performance of the storage battery.

8. The method as claimed in claim 1, further comprising:
   linking the performance of the storage battery to a result from another method for determining the state of charge, performance, availability or age of the storage battery; and
   displaying the result of the linking, or a variable derived from it.

9. The method as claimed in claim 1, wherein a conversion to value A1* for a selected given SOC* and a selected temperature $T_{BAT}*$ is carried out from comparison values $A1_T$ by using information about a functional relationship between the values $A1_T$ and as a function of SOC and $T_{BAT}$, for all state values A1 obtained, whose state of charge SOC and battery temperature $T_{BAT}$ do not correspond to SOC* and $T_{BAT}*$, and wherein the present performance for SOC* and $T_{BAT}*$ is determined from the magnitude of this state value A1*, for SOC* and $T_{BAT}*$.

10. The method as claimed in claim 1, wherein a limit value $A1_L$ of the state value is predetermined for the performance of the storage battery for a defined state of charge $SOC_L$ and a defined battery temperature $T_{BATL}$, wherein a conversion to a value A1* for $SOC_L$ and $T_{BATL}$ is carried out for all those state values A1 obtained whose state of charge SOC and battery temperature $T_{BAT}$ do not correspond to those for the limit value $A1_L$, wherein present performance for $SOC_L$ and $T_{BATL}$ is determined from the magnitude of this state value A1* for $SOC_L$ and $T_{BATL}$ as the ratio to the limit value $A1_L$ for $SOC_L$ and $T_{BATL}$, and wherein the ratio is used as a measure for instantaneous performance of the storage battery.

11. The method as claimed in claim 1, wherein the performance of the storage battery determined is used to control auxiliary functions.

* * * * *